US012745480B2

(12) United States Patent
Koestler et al.

(10) Patent No.: US 12,745,480 B2
(45) Date of Patent: Sep. 22, 2026

(54) METHOD FOR STRIPPING A III-V SEMICONDUCTOR LAYER EPITAXIALLY GROWN ON A SEMICONDUCTOR WAFER

(71) Applicant: AZUR SPACE Solar Power GmbH, Heilbronn (DE)

(72) Inventors: Wolfgang Koestler, Heilbronn (DE); Steffen Sommer, Tamm (DE); Chérubin Noumissing Sao, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 381 days.

(21) Appl. No.: 18/601,486

(22) Filed: Mar. 11, 2024

(65) Prior Publication Data

US 2024/0304746 A1 Sep. 12, 2024

(30) Foreign Application Priority Data

Mar. 9, 2023 (DE) ..................... 10 2023 000 892.3

(51) Int. Cl.
*H01L 31/18* (2006.01)
*H10F 71/00* (2025.01)

(52) U.S. Cl.
CPC ........... *H10F 71/127* (2025.01); *H10F 71/00* (2025.01)

(58) Field of Classification Search
CPC ...... H10F 10/144; H10F 10/163; H10F 71/00; H10F 71/127; H10F 71/1274;
(Continued)

(56) References Cited

U.S. PATENT DOCUMENTS 8,330,036 B1 12/2012 Park
2009/0035534 A1* 2/2009 Su .......................... H10P 54/00 438/700

(Continued)

FOREIGN PATENT DOCUMENTS

KR 20160047759 A 5/2016

OTHER PUBLICATIONS

Lin, Chia-Feng et al: Chemical lift-off process for blue light emitting diodes. In: Applied physics express, 3, 2010, 9, 092101-1-092101-3.

(Continued)

*Primary Examiner* — David C Spalla
(74) *Attorney, Agent, or Firm* — Muncy, Geissler, Olds & Lowe, P.C.

(57) ABSTRACT

A method for stripping a III-V semiconductor layer epitaxially grown on a semiconductor wafer, and the semiconductor wafer is designed as a substrate and has an upper side, a buffer layer and the semiconductor layer being formed on the upper side, and a carrier layer being formed above the semiconductor layer, and the sacrificial layer having a higher wet chemical etching rate compared to the semiconductor layer, the semiconductor layer being introduced into a receiving device in a process step, and position data of points arranged on the upper side being read out from a memory device in a process step, and a laser approaching the points based on the position data in a process step, and holes having a base being produced through the carrier layer and the layer formed beneath the carrier layer via the laser, the base of the hole being formed within the buffer layer.

14 Claims, 1 Drawing Sheet

(58) Field of Classification Search
CPC .. H10P 14/3211; H10P 14/3411; H10P 50/60; H10P 50/642; H10P 50/646
See application file for complete search history.

(56) References Cited

U.S. PATENT DOCUMENTS

| | | | | |
|---|---|---|---|---|
| 2012/0322200 | A1* | 12/2012 | Afzali-Ardakani ... | H10F 77/211 257/E31.124 |
| 2016/0155881 | A1 | 6/2016 | Kayes et al. | |
| 2016/0293489 | A1 | 10/2016 | Hayes et al. | |
| 2021/0066534 | A1* | 3/2021 | Koestler ............... | H10F 10/142 |
| 2025/0132295 | A1* | 4/2025 | Aoike ..................... | H10P 95/11 |

OTHER PUBLICATIONS

Wulf, Jana et al, “Thin Film GaAs Solar Cell Enabled by Direct Rear-Side Plating and Patterned Epitaxial Lift-Off,”, ISE, Germany, Jun. 20-25, 2021 IEEE 48th Photovoltaic Specialists Conference (PVSC), Fort Lauderdale, FL, USA, ISSN: 0160-8371.

Lin, Chia-Feng et al: “Fabrication of InGaN light-emitting diodes with embedded air-gap disks using laser-drilling and electrochemical processes”Applied Physics Express, vol. 7, Nr. 7, Jun. 18, 2014, pp. 1-4 XP093172869.

Englhard, M. et al: “A novel vacuum epitaxial lift-off (VELO) process for separation of hard GaAs substrate/carrier systems for a more green semiconductor LED production” Materials Science in Semiconductor Processing, Sep. 8, 2017, vol. 71, pp. 389-395, XP055445533.

Wu, Fan-Lei et al: Improvement in separation rate of epitaxial lift-off by hydrophilic solvent for GaAs solar cell applications Solar Energy Materials and Solar Cells, Elsevier Science Publishers, Amsterdam, vol. 122, Jan. 1, 2014, pp. 233-240, XP028817631.

* cited by examiner

METHOD FOR STRIPPING A III-V SEMICONDUCTOR LAYER EPITAXIALLY GROWN ON A SEMICONDUCTOR WAFER

This nonprovisional application claims priority under 35 U.S.C. § 119(a) to German Patent Application No. 10 2023 000 892.3, which was filed in Germany on Mar. 9, 2023, and which is herein incorporated by reference.

BACKGROUND OF THE INVENTION

Field of the Invention

The invention relates to a method for stripping a III-V semiconductor layer epitaxially grown on a semiconductor wafer.

Description of the Background Art

A stripping process for GaAs semiconductor layers is known from Jana Wulf et al, "Thin Film GAAs Solar Cell Enabled by Direct Rear-Side Plating and Patterned Epitaxial Lift-Off,", ISE, Germany, 20-25 Jun. 2021 IEEE 48th Photovoltaic Specialists Conference (PVSC), Fort Lauderdale, FL, USA, ISSN: 0160-8371. An intermediate layer sequence is provided on a GaAs substrate with the aid of an MOVPE epitaxy process on the substrate, the intermediate layer sequence comprising a multiplicity of layers. A semiconductor layer designed as a GaAs solar cell is grown on the intermediate layer sequence, lattice-matched to the substrate. The upper side of the GaAs solar cell is then covered up to strip-shaped openings with the aid of a mask process, and a cross-like trench pattern is produced in the component layer with the aid of a nonselective wet etching process for the purpose of exposing the sacrificial layer. In a further process step, a structured metal film is aligned as a transfer layer and applied to the surface of the solar cell in such a way that the trench pattern remains open for the purpose of introducing a hydrofluoric acid. Th sacrificial layer, which is 20 nm thick and is made up of AlAs, is then etched away with the aid of hydrofluoric acid, and the semiconductor layer or the GaAs solar cell is stripped from the substrate.

SUMMARY OF THE INVENTION

It is therefore an object of the present invention to provide a method for stripping a III-V semiconductor layer epitaxially grown on a semiconductor wafer.

The semiconductor wafer has a diameter of at least 100 mm or 150 mm or more.

The semiconductor wafer is designed as a substrate and has an upper side and an underside and a thickness of more than 100 μm. The semiconductor wafer comprises a III-V material or a group IV material or is made up of a III-V material or a group IV material. For example, the semiconductor wafer is made from InP or GaAs or from Ge.

A buffer layer having an upper side and an underside is formed on the upper side of the semiconductor wafer.

A sacrificial layer can be formed on the upper side of the buffer layer, and the semiconductor layer is arranged above the sacrificial layer for a formation of components, the semiconductor layer having a thickness of more than 0.5 μm.

The aforementioned layers may each comprise a III-V material or are made up of a III-V material. Examples of III-V materials are GaAs, InP, InGaP, InGaAsP.

A carrier layer can be formed above the semiconductor layer, the carrier layer and the semiconductor layer comprising different materials. The carrier layer preferably as a thickness of more than 10 μm.

Compared to the semiconductor layer, the sacrificial layer can have a wet chemical etching rate which is higher by at least a factor of 10.

Furthermore, the sacrificial layer and the buffer layer and the semiconductor layer and the carrier layer can each be formed over a wide area or are at least each formed over a wide area in a central region of the semiconductor wafer. The central region has a radius of at least 40 mm.

In a process step, the semiconductor wafer can be introduced or inserted into a receiving device. The receiving device can comprise a planar underlay on which the semiconductor wafer is placed. The substrate, including the semiconductor wafer, can be electromotively movable in at least two spatial directions.

In a process step, position data of points arranged on the upper side of the semiconductor wafer can be read out from a memory device.

In a process step, points predefined on the basis of the position data are approached with the aid of a positioning device, the positioning device comprising a laser, and holes having a base can be produced with the aid of the laser through the carrier layer and the layers formed beneath the carrier layer at at least a portion of the points.

The laser can be controlled in such a way that the base of the particular hole is formed within the buffer layer.

An etching solution can be introduced into the holes in a wet chemical process step with the carrier layer situated on top for the purpose of at least partially removing the sacrificial layer and stripping the semiconductor layer.

It should be noted that the process steps mentioned can be carried out in the indicated sequence.

It should be noted that the etching solution can be designed in such a way that the carrier layer and the semiconductor layer are affected as little as possible. In other words, the etching solution selectively dissolves the sacrificial layer. It is advantageous to achieve the highest possible selectivity, i.e., to etch away the sacrificial layer quickly.

It should furthermore be noted that the carrier layer formed above the semiconductor layer can have at least a different stoichiometry than the semiconductor layer.

The central region can be preferably unstructured, i.e., the layers each have a flat plane. However, it is understood that portions can have a topography, in particular in the vicinity of the edge of the semiconductor wafer.

It should also be noted that, the central region can be unstructured, but can also have a topography due to the underlay. The term "underlay" refers to the layers between the substrate and the carrier layer. In other words, the carrier layer or any further layers situated on top of the carrier layer cover a wide area and are each not themselves structured.

An advantage of the present method is that the carrier layer as well as the underlying layers are opened or structured only with the aid of the laser. There is no need for complex masks and alignment method steps for orienting the structured layers to each other.

A further advantage is that the sacrificial layer may be etched in a material-specific manner to the greatest possible extent with the aid of a highly selective, wet chemical etching step. The component useful surface area may be significantly enlarged, in particular, in connection with the highly precise holes produced by the laser. There is no need to use different etching solutions, with the aid of which the trenches are widened.

Another advantage is that arbitrary patterns may be easily and quickly produced with the aid of the laser. In other words, different component structures may be easily produced without complex mask processes. In particular, it has been shown that a multiplicity of holes may be quickly produced in a 100-mm semiconductor wafer. In the present case, a multiplicity can be understood to be a number of holes in a range between 1,000 and 10,000 holes or in a range between 4,000 and 6,000 holes. It was shown that the semiconductor layer may be easily and reliably stripped due to the aforementioned multiplicity of holes.

In an example, exactly one hole can be produced at each point, using the laser. The laser is then moved to a further point in order to produce another hole with the aid of the laser.

The holes can be produced exclusively with the aid of the laser. As mentioned above, it is advantageous that a pre-structuring, in particular using complex and expensive mask processes, is omitted. It is understood that all layers situated on top of the buffer layer are bored through with the aid of the laser, in some examples, the layers situated on top comprising not only the III-V semiconductor layers, but also, in particular, metal layers and/or plastic layers.

The holes are spaced a distance apart. The distance between two directly adjacent holes is preferably in a range between 0.001 mm and 10 mm or between 2 mm and 5 mm.

The holes can have a diameter in a range between 1 μm and 100 μm or between 10 μm and 60 μm or 30 μm±5 μm. The holes preferably have a circular or oval design. In one refinement, the holes have a nearly perpendicular or exactly a perpendicular side wall. The term "nearly" is understood to be a deviation of ±10° from the perpendicular.

The diameter of the holes at the opening can deviate from the diameter at the base by less than 25% or less than 10%. The diameter at the opening is preferably larger than or the same size as the diameter at the base of the particular hole.

The holes can be arranged one after the other in such a way that the holes join each other. In the present case, "join each other" is understood to be that a side wall having a thickness of less than 1 mm or no side wall is formed between two adjacent holes at the height of the opening of the holes.

The holes can be arranged one after the other along the line in such a way that a trench-shaped structure or a sequence of elongated holes is formed. Studies have shown that the duration of the wet chemical etching may be shortened with the aid of the trench-shaped structure.

The holes can be arranged along multiple lines, the lines forming a cross-shaped pattern or the outsides of a square or multiple squares. The duration of the wet chemical etching may be influenced by the number of lines or the number of squares.

The carrier layer can comprise a metal layer and/or a III-V material, or the carrier layer can be made up of a metal layer or is made up of a III-V material.

The carrier layer can have a thickness between 20 μm and 500 μm or between 50 μm and 300 μm or between 100 μm and 200μ. The metal layer can comprise or is made up of multiple different metal layers.

The carrier layer can be designed to be materially bonded to the semiconductor layer.

A spacer layer can be formed between the carrier layer and the metal layer. The spacer layer has a thickness between 0.1 μm and 10 μm or between 0.3 μm and 7 μm or between 0.5μ m and 2μ m.

The spacer layer can be designed as a conductive or as a semiconductive or as an insulating semiconductor layer. The spacer layer can be designed as a dielectric layer.

The spacer layer can be structured, in particular when designed as a dielectric layer, to electrically connect the metallic carrier layer to the semiconductor layer. The metallic carrier layer is designed as a contact layer. The dielectric layer can have recesses for the electrical connection with the aid of the metal layer, which are in a range from 5% to 20% or in the range of 10%.

If a semiconductor component is formed in the semiconductor layer, or if the semiconductor layer itself is the component, the electrical component or the semiconductor layer may be electrically advantageously and reliably joined by the contact layer.

The connection resistance should be as low as possible. The contact resistance is preferably in a range between 0.01 ohm and 2 ohms or in a range between 0.1 ohm and 0.5 ohm.

A transfer layer can be arranged on the carrier layer before or after the generation of the holes, preferably arranged in a materially bonded manner on the carrier layer. If the transfer layer is arranged before the generation of the holes, the holes can be produced through the transfer layer with the aid of the laser.

The transfer layer can comprise a metal layer and/or a plastic layer, or the transfer layer is made up of a metal layer or is made up of a plastic layer.

The transfer layer can comprise or is made up of a multilayer layer system. The carrier layer can have a thickness between 20 μm and 500 μm or between 50 μm and 300 μm or between 100 μm and 200 μm.

The sacrificial layer can have a thickness between 5 nm and 20 nm. The sacrificial layer can have a wet chemical etching rate that is higher by a factor of at least 100 or at least 500, compared to the semiconductor layer.

The buffer layer can have a thickness in a range from 0.5 μm to 50 μm or in a range between 1.0 μm and 30 μm or in a range between 5 μm and 10 μm.

The buffer layer can have a lattice constant on an underside, formed in the direction of the substrate, which is the same as or different than an upper side formed in the direction of the sacrificial layer. It should be noted that the lattice constant in the underside matches the lattice constant of the substrate.

The lattice constant of the semiconductor layer can be determined with the lattice constants on the upper side of the buffer layer. If the two lattice constants of the buffer layer are the same, the lattice constants of the substrate correspond to the lattice constant of the semiconductor layer. In other words, the entire layer stack of the semiconductor layers is lattice-matched.

The same is true if no further layers are formed between the upper side of the semiconductor wafer and the underside of the buffer layer; in this case as well, the lattice constant of the upper side of the semiconductor wafer matches the lattice constant of the underside.

If the lattice constants of the buffer layer are different, the buffer layer comprises a metamorphic layer system in another refinement. In other words, the buffer layer is designed as a metamorphic buffer. The lattice constant on the upper side of the buffer layer can be greater than the lattice constant on the underside of the buffer layer.

The sacrificial layer can comprise AlAs or is made up of AlAs, and/or the sacrificial layer can comprise InGaP or is made up of InGaP.

The sacrificial layer can have a wet chemical etching rate that is higher by a factor of at least 10 or by a factor of at least 100 or by a factor of at least 500, compared to the material of the semiconductor wafer and/or compared to the semiconductor layer.

The sacrificial layer can have a wet chemical etching rate that is higher by a factor of at least 10 or by a factor of at least 100 or by a factor of at least 500, compared to the buffer layer.

The sacrificial layer has a III-V bonding which is different than that of the buffer layer and than that of the semiconductor layer.

The semiconductor layer can have a thickness in a range from 1 μm to 150 μm or in a range from 10 μm to 80 μm or in a range from 20 μm to 40 μm.

The semiconductor layer can comprise or is made up of GaAs or of InGaAs or of InGaAsP or of (Al) InGaP.

The semiconductor layer can be made up of exactly one layer or of a multiplicity of semiconductor layers. The multiplicity of III-V semiconductor layers preferably have different III-V bondings.

The semiconductor layer can comprise or is made of a III-V multijunction solar cell. The semiconductor layer can comprise GaAs or InGaAs or the semiconductor layer can be made up of GaAs or InGaAs.

The semiconductor layer can be designed as a high-blocking diode having a reverse voltage of more than 200 V.

An intermediate layer can be formed between the buffer layer and the semiconductor wafer.

The intermediate layer can have a different material composition or at least a different stoichiometry than the two layers materially bonded with the intermediate layer.

The intermediate layer can have a thickness between 2 nm and 20 nm. The intermediate layer can have a wet chemical etching rate that is higher by a factor of at least 10 or by a factor of at least 100 or by a factor of at least 500, compared to the material of the semiconductor wafer.

The intermediate layer can comprise a III-V material or is made up of a III-V material.

The semiconductor layer can be placed on an underlay after stripping to carry out further method steps.

In an example, after stripping, the sacrificial layer can be completely removed from the underside of the semiconductor layer in a further wet chemical step.

At least one or none of the aforementioned layers is missing in an edge region, the edge region comprising a lateral extension of less than 3% of the radius of the semiconductor wafer.

The semiconductor wafer can be adjusted to a lateral accuracy of +/−100 μm or +/−50 μm or +/−10 μm with the aid of the receiving device.

A dielectric layer can be formed between the carrier layer and the semiconductor layer. The dielectric layer is preferably structured so that the semiconductor layer is electrically contacted with the aid of the metal layer.

The sacrificial layer and the buffer layer can comprise the same material or are made up of the same material or have the same bonding. In particular, the sacrificial layer and the buffer layer have the same stoichiometry.

The duration and/or the strength of the laser beam can be varied with the aid of a controller to set the geometric shape and/or the depth of the holes. A control of the laser takes place with the aid of an end point detection.

The duration as well as the strength can be varied and an end point detection can also be used for a control of the laser.

A further buffer layer can be formed between the sacrificial layer and the semiconductor layer, so that the sacrificial layer may be formed between the buffer layer and the further buffer layer as a sandwich structure. The further buffer layer can have at least a different stoichiometry compared to the sacrificial layer, the layers preferably having different III-V bondings.

The further buffer layer can have a thickness in a range from 0.5 μm to 50 μm or in a range between 1.0 μm and 30 μm or in a range between 5 μm and 10 μm.

The buffer layer and the further buffer layer can be made up of or comprise the same III-V bondings or different III-V bondings.

An etch stop layer can be formed between the further buffer layer and the semiconductor layer. The etch stop layer can have at least a different stoichiometry compared to the semiconductor layer and compared to the further buffer layer, the layers preferably having different III-V bondings than each other.

The further buffer layer and the semiconductor layer can have the same III-V bonding but a different bonding than the sacrificial layer.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
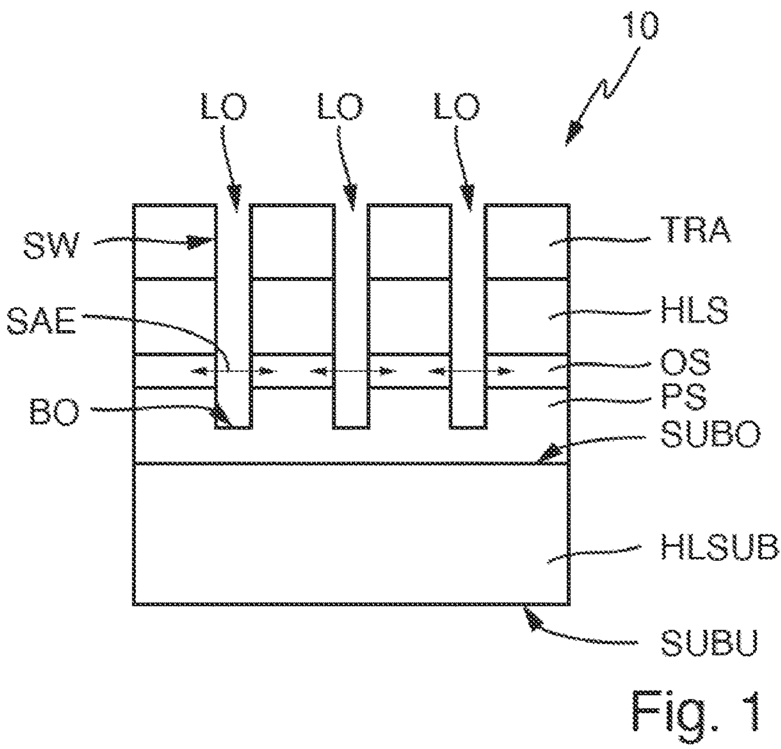
FIG. 1 shows a cross-sectional view of a section of a semiconductor wafer in the form of a layer structure.

The illustration in FIG. 1 shows a cross-sectional view of a section of a semiconductor wafer HLSUB in the form of a layer structure 10.

Layer structure 10 comprises semiconductor wafer HLSUB designed as a substrate, the semiconductor wafer having an upper side SUBO and an underside SUBU. A buffer layer PS is formed on upper side SUBO. A sacrificial layer OS is arranged on the upper side of buffer layer PS, and a semiconductor layer HLS is arranged above sacrificial layer OS for the purpose of forming components. Semiconductor layer HLS has a thickness of more than 0.5 μm.

A carrier layer TRA is formed above semiconductor layer HLS. Three holes LO have been produced from the upper side of carrier layer TRA with the aid of a laser. Holes LO have vertical side walls SW and a base BO.

After holes LO have been produced, sacrificial layer OS is removed in a wet chemical manner with the aid of an etching solution SAE.

Figure 2:
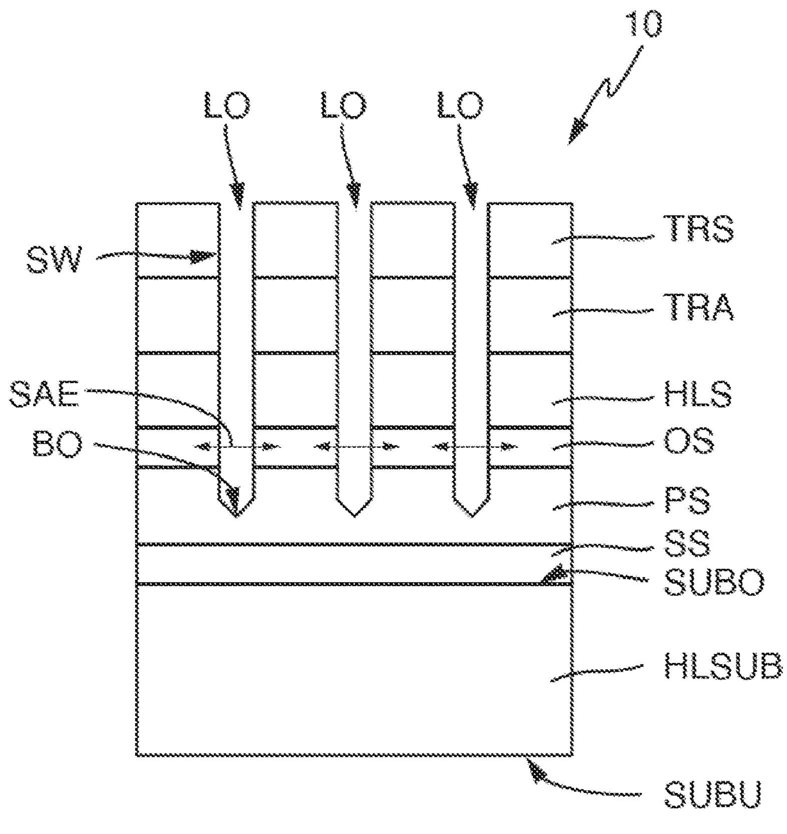
FIG. 2 shows a cross-sectional view of a further layer structure.

A cross-sectional view of a further layer structure 10 is shown in the illustration in FIG. 2. Only the differences from the illustration in FIG. 1 are explained below.

A transfer layer TRS is formed on carrier layer TRA. In that holes LO were produced after the formation of transfer layer TRS, holes LO begins on the surface of transfer layer TRS. In contrast to the illustration in FIG. 1, base BO of the holes has a conical design to clarify the geometric variation breadth of base BO.

An etch stop layer SS is furthermore arranged between buffer layer PS and the semiconductor layer. An advantage of etch stop layer SS is that the surface of semiconductor wafer HLSUB may be easier to clean.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for stripping a III-V semiconductor layer epitaxially grown on a semiconductor wafer, the semiconductor wafer having a diameter of at least 100 mm, the semiconductor wafer being designed as a substrate and comprises a III-V material or a group IV material or is made up of a III-V material or a group IV material, the semiconductor wafer having an upper side and an underside, the method comprising:

forming a buffer layer on the upper side;

forming a sacrificial layer on the upper side of the buffer layer;

arranging the semiconductor layer above the sacrificial layer for a formation of components, the semiconductor layer having a thickness of more than 0.5 μm, the buffer layer, sacrificial layer, and semiconductor layer each comprising a III-V material or are made up of a III-V material;

forming a carrier layer above the semiconductor layer, the carrier layer and the semiconductor layer comprising different materials, and the carrier layer having a thickness of more than 10 μm, the sacrificial layer having a wet chemical etching rate which is higher by a factor of at least 10 compared to the semiconductor layer;

forming the sacrificial layer and the buffer layer and the semiconductor layer and the carrier layer over a wide area or over a wide area in a central region of the semiconductor wafer, the central region having a radius of at least 40 mm;

introducing the semiconductor wafer into a receiving device;

reading out position data of points arranged on the upper side of the semiconductor wafer from a memory device, the points being arranged along a line;

producing holes having a base, in that a laser approaches the predefined points based on the position data, the holes being produced through the carrier layer and the layers formed beneath the carrier layer at least a portion of the points, using the laser;

controlling the laser such that the base of the particular hole is formed within the buffer layer; and introducing an etching solution into the holes in a wet chemical process step with the carrier layer arranged on top for the purpose of at least partially removing the sacrificial layer and stripping the semiconductor layer, wherein the process steps are performed in the listed sequence.

2. The method according to claim 1, wherein the holes are produced exclusively with the aid of the laser.

3. The method according to claim 1, wherein the holes are arranged one after the other along the line in such a way that a trench-shaped structure or a sequence of elongated holes is formed.

4. The method according to claim 1, wherein the carrier layer comprises a metal layer and/or a III-V material.

5. The method according to claim 1, wherein a transfer layer is arranged on the carrier layer before or after the production of the holes.

6. The method according to claim 5, wherein the transfer layer comprises a metal layer and/or a plastic layer or is made up of a metal layer or a plastic layer, and the carrier layer has a thickness between 20 μm and 500 μm.

7. The method according to claim 1, wherein the sacrificial layer has a thickness between 5 nm and 20 nm, and the sacrificial layer has a wet chemical etching rate which is higher by a factor of at least 100, compared to the semiconductor layer.

8. The method according to claim 1, wherein the buffer layer has a thickness in a range of 0.5 μm to 50 μm, and the buffer layer has a wet chemical etching rate which is higher by a factor of at least 10 or by a factor of at least 100, compared to the material of the semiconductor wafer and/or compared to the semiconductor layer.

9. The method according to claim 1, wherein the semiconductor layer comprises a plurality of different III-V semiconductor layers and is designed as a III-V multijunction solar cell.

10. The method according to claim 1, wherein the sacrificial layer comprises AlAs or is made up of AlAs, or the sacrificial layer comprises InGaP or is made up of InGaP.

11. The method according to claim 1, wherein at least one or none of the buffer layer, sacrificial layer, or semiconductor layer is missing in an edge region, the edge region comprising a lateral extension of less than 3% of the radius of the semiconductor wafer.

12. The method according to claim 1, wherein a dielectric layer is formed between the carrier layer and the semiconductor layer, the dielectric layer being structured so that the semiconductor layer is electrically contacted with the aid of the metal layer.

13. The method according to claim 1, wherein the sacrificial layer and the buffer layer comprise the same material or are made up of the same material, or the sacrificial layer and the buffer layer have the same stoichiometry.

14. The method according to claim 1, wherein the geometric shape and/or the depth of the holes is/are influenced with the aid of a control of the duration and/or the strength of the laser beam.

* * * * *